United States Patent [19]

Machida et al.

[11] Patent Number: 4,827,157
[45] Date of Patent: May 2, 1989

[54] PERIODIC SIGNAL GENERATOR CIRCUIT

[75] Inventors: Hirohisa Machida; Takeo Nakabayashi, both of Hyogo, Japan

[73] Assignee: Mitsubishi Denki Kabushiki Kaisha, Tokyo, Japan

[21] Appl. No.: 125,470

[22] Filed: Nov. 27, 1987

[30] Foreign Application Priority Data

Nov. 28, 1986 [JP] Japan .................................. 61-284647

[51] Int. Cl.$^4$ ...................... H03K 3/037; H03K 3/356
[52] U.S. Cl. .................................... 307/262; 307/263; 307/269; 307/363
[58] Field of Search ............... 307/363, 262, 263, 269, 307/443, 291; 328/62

[56] References Cited

U.S. PATENT DOCUMENTS 4,417,158  11/1983  Ito et al. .............. 307/269
4,554,465  11/1985  Koike .................. 307/291
4,691,122   9/1987  Schnizlein et al. ........ 307/269

OTHER PUBLICATIONS

Patent Abstracts of Japan E-238, Dec. 21, 1984, vol. 8/No. 281, Tietze & Schenk Publication–"Semiconductor Circuit Technology".

Primary Examiner—John Zazworsky
Attorney, Agent, or Firm—Lowe, Price, LeBlanc, Becker & Shur

[57] ABSTRACT

In a periodic signal generator circuit, logical threshold values of an inverter for inverting an output signal of a first logical gate circuit (1) and inputting the same to a second logical gate circuit (2) and an inverter (40) for inverting an output signal of the second logical gate circuit (2) and inputting the same to the first logical gate circuit are set low, so that the time when an output signal of one of the logical gate circuits (1, 2) is inverted by inverting an output signal of the other logical gate circuit is delayed. Thus, the periodic signal generator circuit generates a so-called two-phase non-overlapped clock signal.

4 Claims, 4 Drawing Sheets

PERIODIC SIGNAL GENERATOR CIRCUIT

BACKGROUND OF THE INVENTION

1. Field of the Invention

The present invention relates to a periodic signal generator circuit for generating a plurality of periodic signals from a single periodic signal.

2. Description of the Prior Art

FIG. 1 is a block diagram showing a shift register receiving a two-phase clock pulse from a conventional periodic signal generator circuit.

In FIG. 1, a shift register 35 comprises latches 31 to 34 connected in series. Each of the latches 31 to 34 accepts data applied to a D input terminal and outputs a signal at an "H" level from a Q output terminal when a clock signal inputted to a clock input terminal C is at the "H" level, and holds data when the clock signal is at an "L" level. The latches 31 to 34 comprise a D type flip-flop.

The shift register 35 shown in FIG. 1 sequentially transmits data In to the latches 31, 32, 33 and 34 by a so-called two-phase non-overlapped clock signal in which clock signals C1 and C2 alternately attain the "H" level. At that time, when the clock signals C1 and C2 simultaneously attain the "H" level, the data In quickly passes through the four latches 31 to 34, so that a malfunction occurs. In order to prevent such a malfunction, the clock signals C1 and C2 must be non-overlapped signals. Description is now made in detail on a periodic signal generator circuit for generating a two-phase non-overlapped clock signal.

FIG. 2 illustrates a conventional clock signal generator circuit used in a semiconductor integrated circuit device.

The clock signal generator circuit, which generates a plurality of clock signals from a single clock signal, mainly comprises a first AND gate circuit 1, a second AND gate circuit 2, a first inverter 30, a second inverter 40 and a third inverter 5.

The first AND gate circuit 1 comprises two NAND circuits 11 and 12, four inverters 13, 14, 5 and 25, a p channel type transistor 17 and an n channel type transistor 18. The first AND gate circuit 1 has two input terminals, one being a node a1 between an input terminal of the inverter 5 and one input terminal of the NAND circuit 12 and the other being a node b1 between an input terminal of the inverter 13 and the other input terminal of the NAND circuit 12, and an output terminal which is a node c1 of a drain of the transistor 17 and a source of the transistor 18.

In the same manner, the second AND gate circuit 2 comprises two NAND circuits 21 and 22, four inverter circuits 23, 24, 25 and 26, a p channel type transistor 27 and an n channel type transistor 28. The second AND gate circuit 2 has two input terminals, one being a node a2 between an input terminal of the inverter 25 and one input terminal of the NAND circuit 22 and a node b2 between an input terminal of the inverter 23 and the other input terminal of the NAND circuit 22, and an output terminal which is a node c2 between a drain of the transistor 27 and a source of the transistor 28.

In the first AND gate circuit 1, the output terminal c1 attains the "H" level only when both the input terminals a1 and b1 attain the "H" level, and the output terminal c1 attains the "L" level in the remaining conditions. In the same manner, in the second AND gate circuit 2, the output terminal c2 attains the "H" level only when both the input terminals a2 and b2 attain the "H" level, and the output terminal c2 attains the "L" level in the remaining conditions.

The output terminal c1 of the first AND gate circuit 1 is connected to one input terminal b2 of the second AND gate circuit 2 through a first inverter 30. In addition, the output terminal c2 of the second AND gate circuit 2 is connected to one input terminal b1 of the first AND gate 1 through a second inverter 40. A clock signal line CLK is connected to the other input terminal a1 of the first AND gate circuit 1 through inverters 61 and 62, and the clock signal line CLK is connected to the other input terminal a2 of the second AND gate circuit 2 through the third inverter 5, and the inverters 61 and 62. The third inverter 5 constitutes a part of the first AND gate circuit 1, and inverts a clock signal and inputs the same to the input terminal a2 of the first AND gate circuit 2.

As shown in FIG. 3, when a clock signal in which "H" and "L" levels are repeated once per clock period is inputted to the clock signal line CLK, a signal of a slightly deformed waveform of the clock signal appears at the output terminal c1 of the first AND gate circuit 1 and a signal of a slightly deformed waveform of the inverted clock signal appears at the output terminal c2 of the second AND gate circuit 2.

When the clock signal changes from the "H" level to the "L" level and a signal at the output terminal c1 of the first AND gate circuit 1 changes from the "H" level to the "L" level, logic of the inverter 30 is inverted at the logical threshold value at point 31a of the signal at the output terminal c1, so that a signal at the output terminal c2 of the second AND gate circuit 2 is inverted from the "L" level to the "H" level at point 31b. In addition, when the clock signal changes from the "L" level to the "H" level and the signal at the output terminal c2 of the second AND gate circuit 2 changes from the "H" level to the "L" level, logic of the inverter 40 is inverted at the logical threshold value at point 41a of the signal at the output terminal c2, so that the signal at the output terminal c1 of the first AND gate circuit 1 is inverted from the "L" level to the "H" level at point 41b. The threshold value of the inverters 30 and 40 is generally a half of a supply voltage Vcc.

Since the signals at the output terminals c2 and c1 are inverted from the "L" level to the "H" level when both signals change from the "H" level to the "L" level and attain the logical threshold value of the inverters 30 and 40, the portions which are not at a 0 level in the waveforms of the two signals overlap with each other in the same time period, as shown in FIG. 3. In FIG. 3, T2 represents a time period when the portions which are not at the 0 level of the signals appearing at the output terminals c1 and c2 overlap with each other.

If the time periods T1 and T2 become longer, the shift register 35 shown in FIG. 1 erroneously operates. In order to prevent such malfunction, a periodic signal generator circuit must be designed so that the time periods T1 and T2 are as short as possible. However, when the distance between the periodic signal generator circuit shown in FIG. 2 and the shift register 35 shown in FIG. 1 is increased, a long interconnection is required, which means that a large capacitive load is connected to the output terminal of the periodic signal generator circuit. Therefore, even if the time periods T1 and T2 when the portions which are not at the 0 level overlap with each other are shorter, deformation of the waveform becomes large when interconnection capacitance is increased, so that the time period T2 is liable to be longer.

It is desirable that the rising and the falling of signals outputted to the output terminals c1 and c2 of the periodic signal generator circuit should be as abrupt as possible so that the time periods T1 and T2 when the portions which are not at the 0 level overlap with each other do not vary due to the change of the load.

SUMMARY OF THE INVENTION

Therefore, a primary object of the present invention is to provide a periodic signal generator circuit capable of improving the periodic state of an external circuit which requires a clock signal having at least two phases.

Another aspect of the present invention is to provide a periodic signal generator circuit capable of increasing separation of a complementary output waveform of a clock signal having at least two phases.

Still another aspect of the present invention is to increase separation of the complementary output waveform of the clock signal having at least two phases without changing the load characteristics.

Additionally, still another aspect of the present invention is to increase separation of the complementary output waveform of the clock signal having at least two phases without changing the conventional circuit structure.

The periodic signal generator circuit according to the present invention is adapted such that logical threshold values of an inverter circuit for inverting an output signal of a first logical gate circuit and inputting the same to a second logical gate circuit and an inverter circuit for inverting an output signal of the second logical gate circuit and inputting the same to the first logical gate circuit are set low, so that the time when an output signal of one of the logical gate circuits is inverted by inverting an output signal of the other logical gate circuit is delayed.

In the periodic signal generator circuit according to the present invention, since the logical threshold values of the inverter circuits are set low, the time when an output signal of one of the logical gate circuits is inverted by inverting an output signal of the other logical gate circuit is delayed, so that the time period when the output signals overlap with each other is reduced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
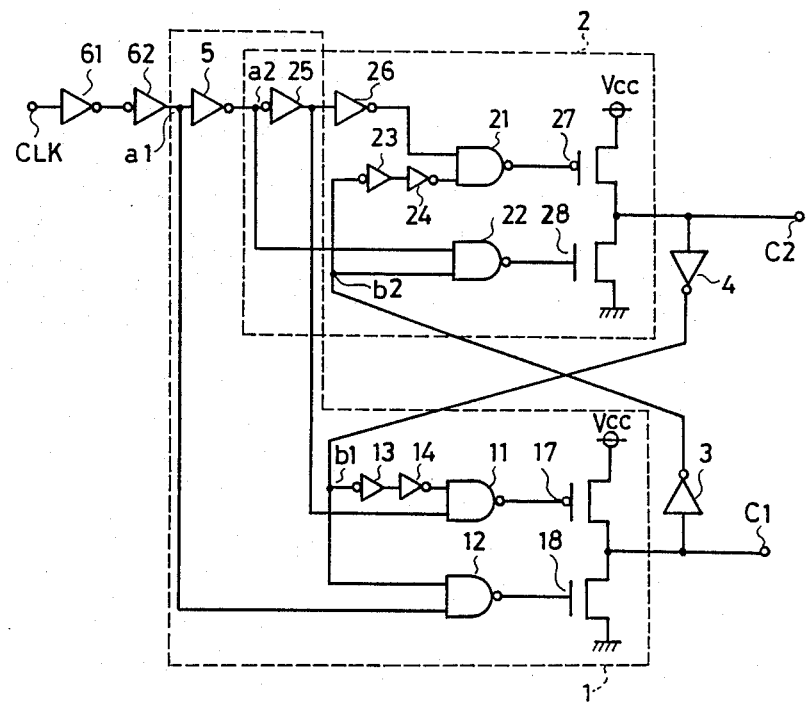
FIG. 4 is a circuit diagram according to an embodiment of the present invention.
Figure 5:
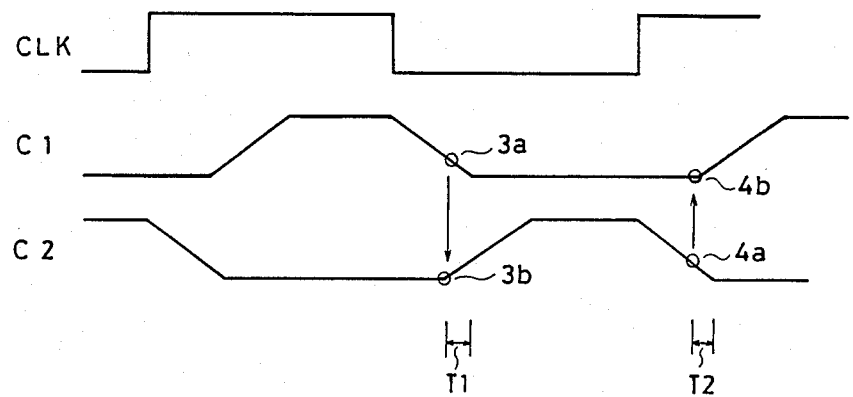
FIG. 5 is a waveform diagram of an input signal and an output signal according to the embodiment of the present invention.

Referring now to FIGS. 4 and 5, description is made on an embodiment of the present invention.

Figure 2:
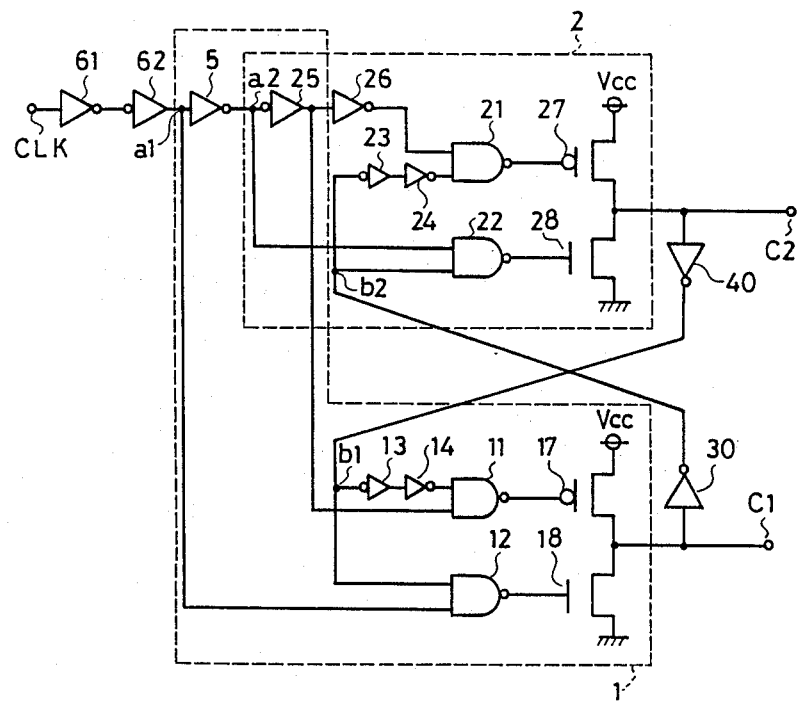
FIG. 2 is a circuit diagram of a conventional clock signal generator circuit.
Figure 3:
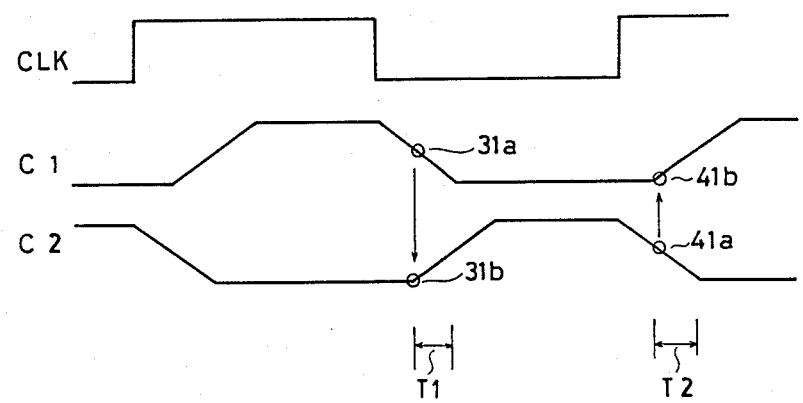
FIG. 3 is a waveform diagram of an input signal and an output signal of the conventional clock signal generator circuit.

FIG. 4 illustrates a clock signal generator circuit according to the present invention, which provides two clock signals to output terminals c1 and c2 from a single clock signal inputted to a clock signal line CLK. The clock signal generator circuit mainly comprises a first AND gate circuit 1, a second AND gate circuit 2, a first inverter 3, a second inverter 4 and a third inverter 5. The first AND gate circuit 1 and the second AND gate circuit 2 have the same structure as the conventional circuit shown in FIG. 2.

More specifically, the first AND gate circuit 1 comprises two NAND circuits 11 and 12, four inverters 13, 14, 5 and 25, and two transistors 17 and 18. In addition, the second AND gate circuit 2 comprises two NAND circuits 21 and 22, four inverters 23, 24, 25 and 26 and two transistors 27 and 28.

In the first AND gate circuit 1, an output terminal c1 attains an "H" level only when both input terminals a1 and b1 attain the "H" level, and the output terminal c1 attains an "L" level in the remaining conditions. In the same manner, in the second AND gate circuit 2, an output terminal c2 attains the "H" level only when both input terminals a2 and b2 attain the "H" level, and the output terminal c2 attains the "L" level in the remaining conditions.

The output terminal c1 of the first AND gate circuit 1 is connected to one input terminal b2 of the second AND circuit 2 through the first inverter 3. In addition, the output terminal c2 of the second AND gate circuit 2 is connected to one input terminal b1 of the first AND gate circuit 1 through the second inverter 4. The inverters 3 and 4 have logical threshold values set low by increasing a channel width of, for example, n channel type transistors constituting the inverter circuits and decreasing a channel width of a p channel type transistor. For example, assuming that a supply voltage is Vcc, the logical threshold values are set to 0.3Vcc.

The clock signal line CLK is connected to the other input terminal a1 of the first AND gate circuit 1 through inverters 61 and 62, and the clock signal line CLK is connected to the other input terminal a2 of the second AND gate circuit 2 through the third inverter 5 and the inverters 61 and 62.

As shown in FIG. 5, when a clock signal in which "H" and "L" levels are repeated once per clock period is inputted to the clock signal line CLK, a signal of a slightly deformed waveform of the clock signal appears at the output terminal c1 of the first AND gate circuit 1, and a signal of a slightly deformed waveform of the inverted clock signal appears at the output terminal c2 of the second AND gate circuit 2. The signals are generated on the same principle as that of the conventional example. However, since a logical threshold value 3a of the inverter 3 is low, the inverter 3 is inverted at a low level of the signal at the output terminal c1. As a result, inversion from the "L" level to the "H" level of the signal in the output terminal c2 is delayed so that the signal is inverted at point 3b. Furthermore, since a logical threshold value 4a of the inverter 4 is low, the inverter 4 is inverted at a low level of the signal at the output terminal c2. As a result, inversion from the "L" level to the "H" level of the signal in the output terminal c1 is delayed so that the signal is inverted at point 4b.

Thus, since the logical threshold values of the inverters 3 and 4 are set low so that inversion from the "L" level to the "H" level of the signals in the output terminals c1 and c2 is delayed, a time period T1 when the portions which are not at a 0 level of both the signals overlap with each other can be reduced, whereby an ideal clock signal having a short time period when the portions overlap with each other can be generated.

Although in the above described embodiment, the logical threshold values of the inverters 3 and 4 are set low by changing a channel width of the transistor constituting the inverters 3 and 4, the logical threshold values may be set low using the other methods. For example, the channel length may be changed.

Description is now made on a method for changing the channel width or the channel length of the transistors constituting the inverters 3 and 4 so that the threshold values are set low.

Figure 1:
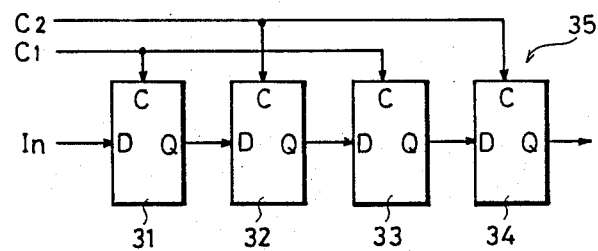
FIG. 1 is a block diagram of a shift register which is driven by a conventional two-phase clock signal.
Figure 6:
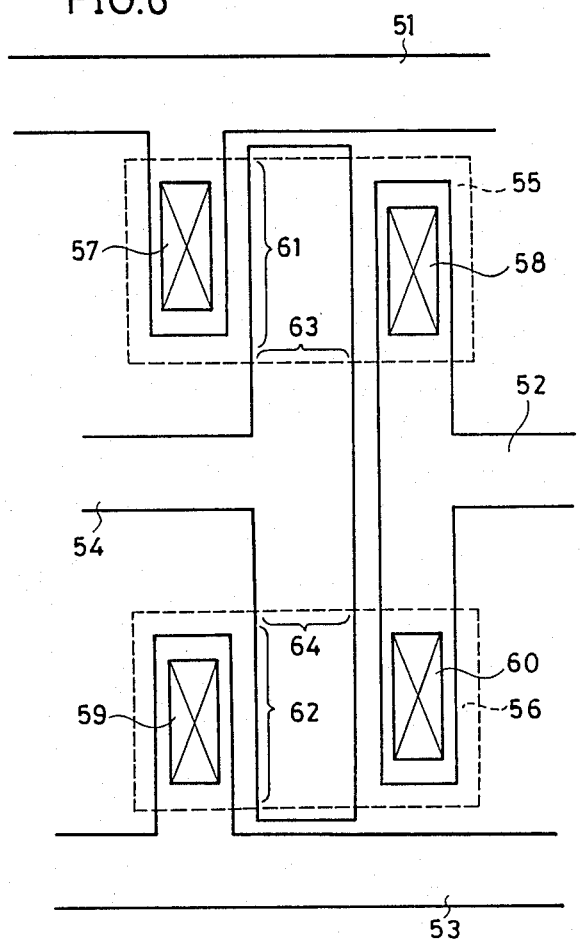
FIG. 6 is a diagram showing an example in which an inverter circuit shown in FIG. 4 is implemented by an integrated circuit.
Figure 7:
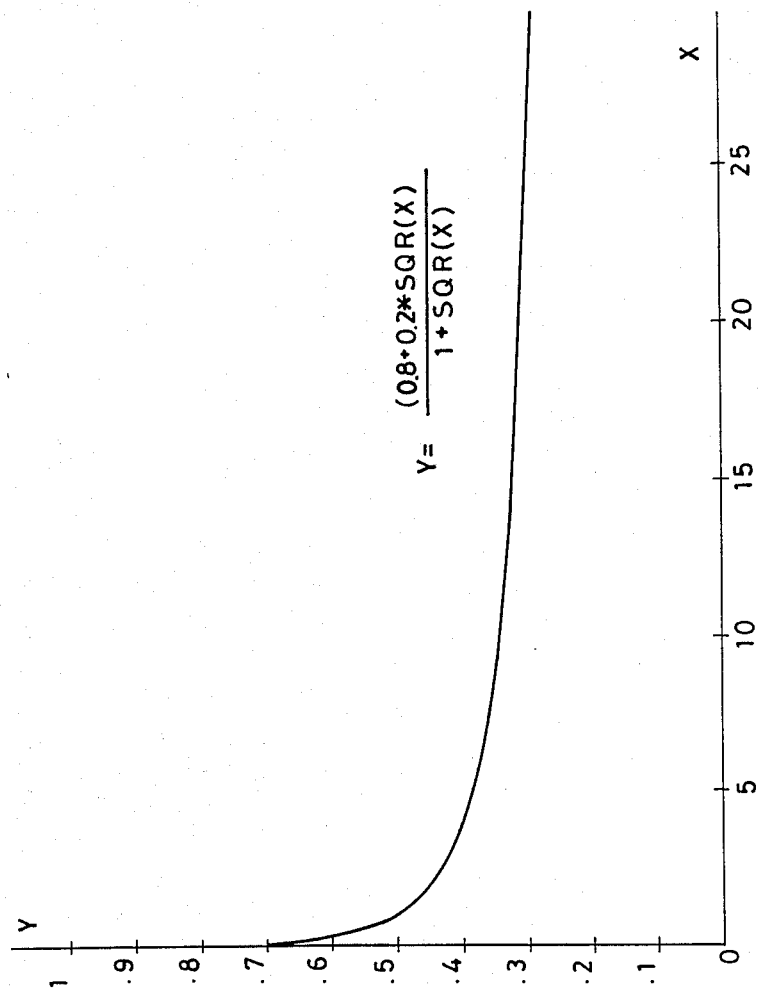
FIG. 7 is a characteristic diagram showing the relation between a threshold voltage and X in the integrated circuit shown in FIG. 6.

FIG. 6 is a diagram showing an example in which the inverter circuit shown in FIG. 4 is implemented by an integrated circuit, and FIG. 7 is a characteristic diagram showing the relation between a threshold voltage and X in the integrated circuit shown in FIG. 6.

In FIG. 6, aluminum interconnections 51, 52 and 53 are formed on a semiconductor substrate. The aluminum interconnection 51 is connected to a power supply, the aluminum interconnection 53 is connected to a ground and the aluminum interconnection 52 serves as an output signal line. A polysilicon interconnection 54 is formed between the aluminum interconnections 51 and 52 and the aluminum interconnections 52 and 53. The polysilicon interconnection 54 serves as an input signal line. In addition, a p type diffusion region 55 is formed under the aluminum interconnections 51 and 52 and the polysilicon interconnection 54, and an n type diffusion region 56 is formed under the aluminum interconnections 52 and 53 and the polysilicon interconnection 54. The p type diffusion region 55 and the aluminum interconnection 51 are connected to each other by a contact 57, and the aluminum interconnection 52 and the p type diffusion region 55 are connected to each other by a contact 58. Furthermore, the aluminum interconnection 52 and the n type diffusion region 56 are connected to each other by a contact 60, and the aluminum interconnection 53 and the n type diffusion region 56 are connected to each other by a contact 59. The portion where the polysilicon interconnection 54 and the p type diffusion region 55 overlap with each other and the portion where the polysilicon interconnection 54 and the n type diffusion region 56 overlap with each other form channels of the transistor and determine the channel widths 61 and 62 and the channel lengths 63 and 64, respectively.

Assuming that a logical threshold voltage of the inverter circuit comprising the semiconductor integrated circuit as described above is Vin, the threshold voltage Vin is determined from the following equation;

$$V_{in} = \frac{V_{cc} + V_{tp} + V_{tn}\sqrt{\frac{\beta n}{\beta p}}}{1 + \sqrt{\frac{\beta n}{\beta p}}}$$

-continued $$\beta p = \frac{\mu p \epsilon}{tox}\left(\frac{Wp}{Lp}\right) \beta n = \frac{\mu n \epsilon}{tox}\left(\frac{Wn}{Ln}\right)$$

The foregoing equation is described in "PRINCIPLES OF CMOS VLSI DESIGN" by Neil H. E. Weste and Kamaran Eshraglian. In this case, Vcc is a power-supply voltage, Vtp and Vtn are threshold voltages of the p type transistor and the n type transistor, respectively, μp and μn represent mobility of a hole and an electron, respectively, ε represents a dielectric constant, tox represents the thickness of a gate oxide film, and W and L represent the channel width and the channel length of the transistor, respectively. Vtn, Vtp, μp, μn, ε and tox are constants determined in manufacturing processes of the semiconductor integrated circuit.

Thus, when Ln, Lp, Wn and Wp are adjusted such that βn equals βp and ideally Vtn equals −Vtp, the logical threshold voltage Vin of the inverter circuit equals ½·Vcc, from the above described equation.

The logical threshold value of the inverter circuit is generally adjusted to be ½·Vcc. Assuming that Vtn equals −Vtp which equals 0.2Vcc, the above described equation is as follows;

$$V_{in} = \left(\frac{0.8 + 0.2\sqrt{X}}{1 + \sqrt{X}}\right) V_{cc}, X = \frac{\beta n}{\beta p}$$

FIG. 7 illustrates a solid curve of $$\frac{0.8 + 0.2\sqrt{X}}{1 + \sqrt{X}}.$$

As seen from the curve, in order to make Vin smaller than 0.3Vcc, the value of X (the ratio of βn to βp) must be relatively large. This means that the difference between the channel widths of the p type transistor and the n type transistor is relatively large, which is not desirable in forming the semiconductor integrated circuit. In addition, in consideration of noise margin and the like, it is desirable that Vin is set to be in the range of 0.2 to 0.4Vcc. Thus, in the present invention, the logical threshold value of the inverter circuit is set to be 0.3Vcc.

At that time, X=βn/βp=25. Assuming that the channel widths Lp and Ln of the p type transistor and the n type transistor are 1.5 μm, the channel width Wp of the p type transistor is 10 μm and the channel width Wn of the n type transistor is 83.3 μm, X nearly equals 25, so that the relation of Vin=0.3Vcc can be achieved. In the present invention, μp=3 μm and Vtn=−Vtp=0.2Vcc.

Furthermore, although in the above described embodiment, a circuit for generating two clock signals from a single clock signal is used, a circuit provided with three or more AND gate circuits and four or more inverters may be used for generating three or more clock signals.

Additionally, the present invention is applied not only to the case of generating a clock signal but also to the case of generating a periodic signal other than the clock signal.

As described in the foregoing, according to the present invention, a time period when output signals overlap with each other is reduced by changing logical threshold values of inverter circuits, so that a malfunction of a circuit controlled by a generated periodic signal is reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a periodic signal generator circuit comprising at least a first logical gate circuit, a second logical gate circuit, a first inverter circuit, a second inverter circuit and a third inverter circuit, said first logical gate circuit receiving an output signal of said second logical gate circuit inputted through said second inverter circuit and a periodic signal, and said second logical gate circuit receiving an output signal of said first logical gate circuit through said first inverter circuit and said periodic signal through said third inverter circuit, the output signal of one of the logical gate circuits being inverted by inverting the output signal of the other logical gate circuit so that complementary periodic signals are outputted respectively from said first logical gate circuit and said second logical gate circuit, an improvement for increasing separation between said complementary periodic signals, where said first inverter circuit and said second inverter circuit are constructed to have thresholds with the range of 0.2 to 0.4 Vcc wherein Vcc is a supply voltage.

2. A periodic signal generator in accordance with claim 1, wherein the logical threshold values of said first inverter circuit and said second inverter circuit are constructed to have thresholds of approximately 0.3Vcc.

3. A periodic signal generator circuit in accordance with claim 1, wherein said first inverter circuit and said second inverter circuit together comprise a p type transistor and an n type transistor, each of said transistors having a channel formed by a source region, a drain region and a channel region between said source region and said drain region, a lead pattern interconnecting said p type transistor and said n type transistor, said p type transistor having a channel providing a threshold with the range of 0.2 to 0.4 Vcc, and said n type transistor having a channel providing a threshold with the range of 0.2 to 0.4 Vcc.

4. A periodic signal generator circuit having increased separation between complementary periodic signal outputs, comprising:

first and second logical gate circuits;

first, second inverter circuits each having an input threshold between 0.2 and 0.4 Vcc where Vcc is a supply voltage; and a third inverter;

wherein said first logical gate circuit receives an output signal of said second logical gate circuit inputted through said second inverter circuit and a periodic signal, and said second logical gate circuit receives an output signal of said first logical gate circuit through said first inverter circuit and said periodic signal through said third inverter circuit, said complementary periodic signals outputted respectively from said first and second logical gate circuits.

* * * * *